US012785647B2

(12) United States Patent
Kimura

(10) Patent No.: US 12,785,647 B2
(45) Date of Patent: Nov. 3, 2026

(54) ACOUSTIC WAVE DEVICE

(71) Applicant: Murata Manufacturing Co., Ltd., Nagaokakyo (JP)

(72) Inventor: Tetsuya Kimura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 382 days.

(21) Appl. No.: 18/096,621

(22) Filed: Jan. 13, 2023

(65) Prior Publication Data

US 2023/0155566 A1 May 18, 2023

Related U.S. Application Data

(63) Continuation of application No. PCT/JP2021/025633, filed on Jul. 7, 2021.

(60) Provisional application No. 63/052,149, filed on Jul. 15, 2020.

(51) Int. Cl.

*H03H 9/02* (2006.01)
*H03H 9/13* (2006.01)
*H03H 9/205* (2006.01)
*H03H 9/60* (2006.01)

(52) U.S. Cl.

CPC ...... *H03H 9/0211* (2013.01); *H03H 9/02031* (2013.01); *H03H 9/133* (2013.01); *H03H 9/205* (2013.01); *H03H 9/605* (2013.01)

(58) Field of Classification Search

None

See application file for complete search history.

(56) References Cited

U.S. PATENT DOCUMENTS 3,940,720 A * 2/1976 Harrington .............. H03H 9/42 365/76
7,135,940 B2 11/2006 Kawakubo et al.
9,748,923 B2 8/2017 Kando et al.
9,780,759 B2 10/2017 Kimura et al.
10,200,013 B2 2/2019 Bower et al.

(Continued)

FOREIGN PATENT DOCUMENTS

CN 110024286 A 7/2019
CN 112352382 A 2/2021

(Continued)

OTHER PUBLICATIONS

International Search Report in PCT/JP2021/025633, mailed Sep. 14, 2021, 4 pages.

(Continued)

*Primary Examiner* — Jonathan D Armstrong
(74) *Attorney, Agent, or Firm* — Keating & Bennett, LLP

(57) ABSTRACT

An acoustic wave device includes a support substrate, a piezoelectric layer on the support substrate, a functional electrode on the piezoelectric layer, and first and second electrode films on the piezoelectric layer, facing each other, and having different electric potentials from each other. When a region between the first and second electrode films in a plan view is an inter-electrode film region, and a region overlapping with the first electrode film or the second electrode film in a plan view is an electrode film underlying region, a thickness of the piezoelectric layer in at least a portion of the inter-electrode film region is smaller than a thickness of the piezoelectric layer in the electrode film underlying region.

20 Claims, 12 Drawing Sheets

(56) References Cited

U.S. PATENT DOCUMENTS

| | | | | |
|---|---|---|---|---|
| 10,491,192 | B1 | 11/2019 | Plesski et al. | |
| 10,601,392 | B2 | 3/2020 | Plesski et al. | |
| 10,790,802 | B2 | 9/2020 | Yantchev et al. | |
| 10,797,675 | B2 | 10/2020 | Plesski | |
| 10,868,513 | B2 | 12/2020 | Yantchev | |
| 11,916,540 | B2 | 2/2024 | Yantchev | |
| 2004/0207033 | A1 | 10/2004 | Koshido | |
| 2004/0233020 | A1* | 11/2004 | Nakamura | H03H 9/02952 333/195 |
| 2005/0200434 | A1* | 9/2005 | Takano | H03H 3/08 333/193 |
| 2005/0275487 | A1* | 12/2005 | Oshio | H03H 3/10 333/195 |
| 2006/0152107 | A1 | 7/2006 | Tanaka | |
| 2007/0001549 | A1 | 1/2007 | Kando | |
| 2007/0170565 | A1 | 7/2007 | Hong et al. | |
| 2008/0106354 | A1* | 5/2008 | Kando | H03H 9/02228 333/193 |
| 2010/0223999 | A1 | 9/2010 | Onoe | |
| 2011/0109196 | A1 | 5/2011 | Goto et al. | |
| 2012/0313483 | A1 | 12/2012 | Matsuda et al. | |
| 2013/0057360 | A1* | 3/2013 | Meltaus | H03H 9/205 29/25.35 |
| 2014/0145556 | A1 | 5/2014 | Kadota | |
| 2014/0152145 | A1 | 6/2014 | Kando et al. | |
| 2016/0028367 | A1 | 1/2016 | Shealy | |
| 2016/0182009 | A1 | 6/2016 | Bhattacharjee | |
| 2016/0285430 | A1 | 9/2016 | Kikuchi et al. | |
| 2017/0005638 | A1 | 1/2017 | Otagawa et al. | |
| 2017/0187352 | A1 | 6/2017 | Omura | |
| 2017/0214387 | A1 | 7/2017 | Burak et al. | |
| 2017/0370791 | A1 | 12/2017 | Nakamura et al. | |
| 2018/0152169 | A1 | 5/2018 | Goto et al. | |
| 2019/0068164 | A1 | 2/2019 | Houlden et al. | |
| 2019/0148621 | A1 | 5/2019 | Feldman et al. | |
| 2019/0238114 | A1 | 8/2019 | Kishimoto et al. | |
| 2019/0386635 | A1 | 12/2019 | Plesski et al. | |
| 2020/0091893 | A1 | 3/2020 | Plesski et al. | |
| 2020/0295730 | A1 | 9/2020 | Nagatomo et al. | |
| 2021/0006228 | A1 | 1/2021 | Garcia | |
| 2021/0013859 | A1 | 1/2021 | Turner et al. | |
| 2021/0273632 | A1 | 9/2021 | Yantchev et al. | |
| 2022/0216842 | A1 | 7/2022 | Nagatomo et al. | |
| 2022/0345112 | A1* | 10/2022 | Ito | H03H 9/02574 |

FOREIGN PATENT DOCUMENTS

| | | | | |
|---|---|---|---|---|
| JP | H0918268 | A | | 1/1997 |
| JP | H10209804 | A | | 8/1998 |
| JP | 2000068781 | A | | 3/2000 |
| JP | 2001244785 | A | | 9/2001 |
| JP | 2004129222 | A | | 4/2004 |
| JP | 2010147591 | A | * | 7/2010 |
| JP | 2010233210 | A | | 10/2010 |
| JP | 2011182096 | A | | 9/2011 |
| JP | 2012257019 | A | | 12/2012 |
| JP | 2013528996 | A | | 7/2013 |
| JP | 2018166259 | A | | 10/2018 |
| JP | 2018207144 | A | | 12/2018 |
| JP | 2019186655 | A | | 10/2019 |
| JP | 2020043442 | A | | 3/2020 |
| WO | 2012137027 | A1 | | 10/2012 |
| WO | 2013021948 | A1 | | 2/2013 |
| WO | 2015098694 | A1 | | 7/2015 |
| WO | 2015156232 | A1 | | 10/2015 |
| WO | 2016017104 | A1 | | 2/2016 |
| WO | 2016052129 | A1 | | 4/2016 |
| WO | 2018096783 | A1 | | 5/2018 |
| WO | 2019111664 | A1 | | 6/2019 |
| WO | 2019241174 | A1 | | 12/2019 |
| WO | 2021060523 | A1 | | 4/2021 |

OTHER PUBLICATIONS

Written Opinion in PCT/JP2021/025633, mailed Sep. 14, 2021, 4 pages.

International Search Report and Written Opinion for PCT Application No. PCT/US2019/036433, mailed Aug. 29, 2019, 9 pages.

International Search Report and Written Opinion for PCT Application No. PCT/US2022/080246, mailed Mar. 30, 2023, 9 pages.

Official Communication issued in corresponding Chinese Patent Application No. 202180049033.3, mailed on July 2, 2026, 11 pages.

* cited by examiner

ACOUSTIC WAVE DEVICE

CROSS REFERENCE TO RELATED APPLICATIONS

This application claims the benefit of priority to U.S. Provisional Application No. 63/052,149 filed on Jul. 15, 2020 and is a Continuation Application of PCT Application No. PCT/JP2021/025633 filed on Jul. 7, 2021. The entire contents of each application are hereby incorporated herein by reference.

BACKGROUND OF THE INVENTION

1. Field of the Invention

The present invention relates to an acoustic wave device.

2. Description of the Related Art

There has been known an acoustic wave device using a plate wave propagating through a piezoelectric film made of $LiNbO_3$ or $LiTaO_3$. For example, Japanese Unexamined Patent Application Publication No. 2012-257019 discloses an acoustic wave device using a Lamb wave as a plate wave. In the acoustic wave device, a piezoelectric substrate is provided on a support body. The piezoelectric substrate is made of $LiNbO_3$ or $LiTaO_3$. An IDT electrode is provided on an upper surface of the piezoelectric substrate. A voltage is applied between multiple electrode fingers of the IDT electrode connected to one side electric potential and multiple electrode fingers of the IDT electrode connected to the other side electric potential. Thus, a Lamb wave is excited. Reflectors are provided on both sides of the IDT electrode. Thus, an acoustic wave resonator using a plate wave is formed.

Japanese Unexamined Patent Application Publication No. 2011-182096 discloses an example of a ladder filter. In the ladder filter, multiple acoustic wave devices are connected by multiple wiring lines. The multiple wiring lines include a wiring line connected to a hot electric potential and a wiring line connected to a ground electric potential. The wiring line connected to the hot electric potential and the wiring line connected to the ground electric potential face each other.

In the acoustic wave resonator as described in Japanese Unexamined Patent Application Publication No. 2012-257019, an unnecessary bulk wave may be excited. The bulk wave propagates in a thickness direction of a piezoelectric substrate. Therefore, the bulk wave may be reflected in a support body. When wiring lines connected to different electric potentials face each other as in Japanese Unexamined Patent Application Publication No. 2011-182096, a signal of an unnecessary bulk wave may be picked up by one wiring line. Alternatively, a signal of an unnecessary bulk wave may be picked up by one of facing busbars. In the cases above, ripples may occur in a frequency characteristic of an acoustic wave device.

SUMMARY OF THE INVENTION

Preferred embodiments of the present invention provide acoustic wave devices that are each able to reduce or prevent ripples in a frequency characteristic.

An acoustic wave device according to a preferred embodiment of the present invention includes a support substrate, a piezoelectric layer on the support substrate, a functional electrode on the piezoelectric layer, and a first electrode film and a second electrode film on the piezoelectric layer, facing each other, and having different electric potentials from each other. When a region between the first electrode film and the second electrode film in a plan view is defined as an inter-electrode film region, and a region overlapping with the first electrode film or the second electrode film in a plan view is defined as an electrode film underlying region, a thickness of the piezoelectric layer in at least a portion of the inter-electrode film region is smaller than a thickness of the piezoelectric layer in the electrode film underlying region.

According to preferred embodiments of the present invention, it is possible to provide acoustic wave devices that are each able to reduce or prevent ripples in a frequency characteristic.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described with reference to the drawings to clarify the present invention.

Each of the preferred embodiments described in the present description is merely an example, and configurations of different preferred embodiments can be partially replaced or combined.

Figure 1:
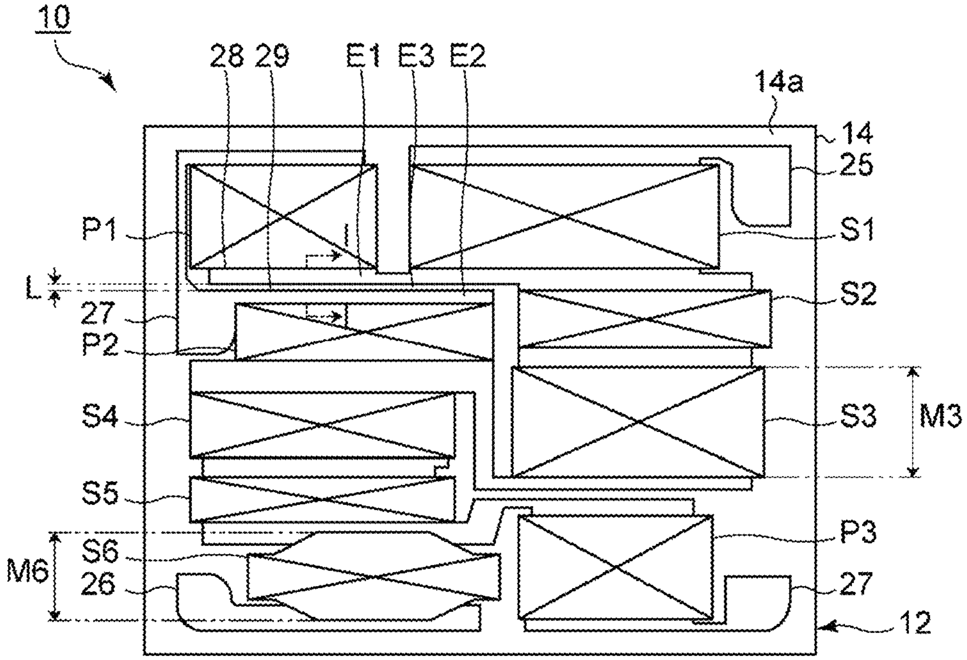
FIG. 1 is a schematic plan view of an acoustic wave device according to a first preferred embodiment of the present invention.
Figure 2:
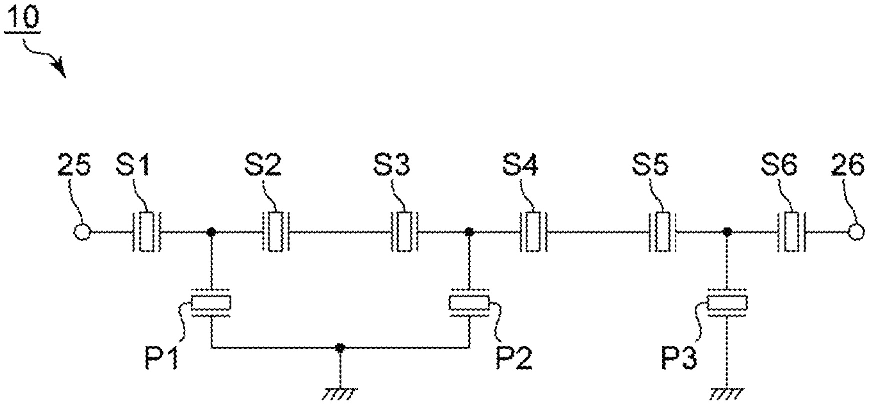
FIG. 2 is a circuit diagram of the acoustic wave device according to the first preferred embodiment of the present invention.

FIG. 1 is a schematic plan view of an acoustic wave device according to a first preferred embodiment of the present invention. FIG. 2 is a circuit diagram of the acoustic wave device according to the first preferred embodiment. In FIG. 1, an acoustic wave resonator is represented by a schematic diagram in which two diagonals are added to a polygon.

As illustrated in FIG. 1 and FIG. 2, an acoustic wave device 10 includes multiple acoustic wave resonators. The acoustic wave device 10 is, for example, a filter device. More specifically, in the present preferred embodiment, the acoustic wave device 10 is, for example, a ladder filter. The multiple acoustic wave resonators are series arm resonators S1, S2, S3, S4, S5, and S6, and parallel arm resonators P1, P2, and P3. Each acoustic wave resonator includes a functional electrode.

Each acoustic wave resonator of the present preferred embodiment uses a bulk wave in a thickness shear mode as a main wave. More specifically, each acoustic wave resonator uses a bulk wave in a thickness shear first order mode as a main wave. Each acoustic wave resonator may be a resonator using a plate wave such as, for example, a Lamb wave as a main wave. On the other hand, in the present preferred embodiment, an SH wave is excited as an unnecessary bulk wave in each acoustic wave resonator.

As illustrated in FIG. 1, the acoustic wave device 10 includes a piezoelectric layer 14. Multiple acoustic wave resonators are provided on the piezoelectric layer 14. Furthermore, multiple wiring line electrode films, a first signal terminal 25, a second signal terminal 26, and multiple ground terminals 27 are provided on the piezoelectric layer 14. The acoustic wave resonators are connected to each other by the wiring line electrode film. The multiple wiring line electrode films include a first electrode film 28 and a second electrode film 29.

The first electrode film 28 and the second electrode film 29 face each other. Each of the first electrode film 28 and the second electrode film 29 extends from different acoustic wave resonators. Specifically, in the present preferred embodiment, the first electrode film 28 is a wiring line electrode film connecting the series arm resonator S1 and the parallel arm resonator P1. The second electrode film 29 is a wiring line electrode film connecting the parallel arm resonator P2 and the ground terminal 27. That is, each of the first electrode film 28 and the second electrode film 29 is connected to a functional electrode. Further, the first electrode film 28 is connected to a hot electric potential, and the second electrode film 29 is connected to a ground electric potential.

However, the arrangement of the first electrode film 28 and the second electrode film 29 is not limited to the above. For example, the first electrode film 28 and the second electrode film 29 may be connected to the same functional electrode. The first electrode film 28 may be connected to the ground electric potential, and the second electrode film 29 may be connected to the hot electric potential. It is sufficient that the first electrode film 28 and the second electrode film 29 are arranged to be connected to electric potentials different from each other, and to face each other.

Figure 3:
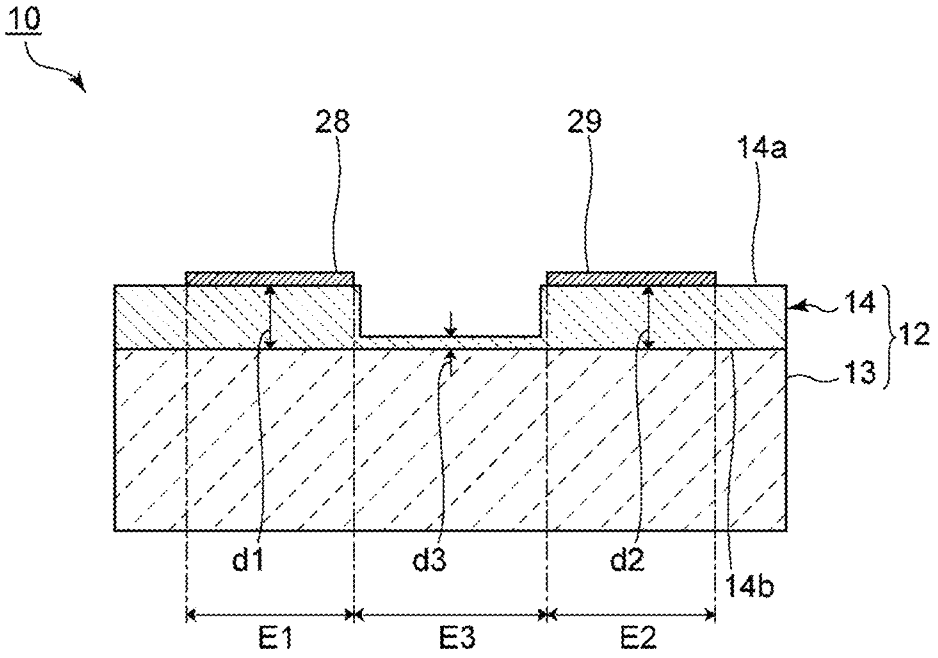
FIG. 3 is a cross-sectional view taken along a line I-I in FIG. 1.

FIG. 3 is a cross-sectional view taken along a line I-I in FIG. 1.

The acoustic wave device 10 includes a piezoelectric substrate 12. The piezoelectric substrate 12 includes a support member 13 and the piezoelectric layer 14. In the present preferred embodiment, the support member 13 includes only a support substrate. The support substrate is, for example, a silicon substrate in the present preferred embodiment. However, the material of the support substrate is not limited to the above, and, for example, sapphire or the like may be used, for example.

The piezoelectric layer 14 includes a first main surface 14*a* and a second main surface 14*b*. The first main surface 14*a* and the second main surface 14*b* are opposed to each other. Of the first main surface 14*a* and the second main surface 14*b*, the second main surface 14*b* is a main surface on the support member 13 side. The multiple wiring line electrode films are provided on the first main surface 14*a*. In the present preferred embodiment, the piezoelectric layer 14 is, for example, a lithium niobate layer. More specifically, the piezoelectric layer 14 is, for example, a $LiNbO_3$ layer. However, the piezoelectric layer 14 may be a lithium tantalate layer such as a $LiTaO_3$ layer, for example.

The acoustic wave device 10 includes an electrode film underlying region. The electrode film underlying region is a region overlapping with the first electrode film 28 or the second electrode film 29 in a plan view. More specifically, the electrode film underlying region includes a first electrode film underlying region E1 and a second electrode film underlying region E2. The first electrode film underlying region E1 is a region overlapping with the first electrode film 28 in a plan view. The second electrode film underlying region E2 is a region overlapping with the second electrode film 29 in a plan view. Further, the acoustic wave device 10 includes an inter-electrode film region E3. The inter-electrode film region E3 is a region positioned between the first electrode film 28 and the second electrode film 29 in a plan view. More specifically, the inter-electrode film region E3 is a region positioned between the first electrode film 28 and the second electrode film 29 adjacent to each other. In the present preferred embodiment, the inter-electrode film region E3 is not provided with an electrode film.

In the following description, a thickness of the piezoelectric layer 14 in the first electrode film underlying region E1 is denoted as d1, a thickness of the piezoelectric layer 14 in the second electrode film underlying region E2 is denoted as d2, and a thickness of the piezoelectric layer 14 in the inter-electrode film region E3 is denoted as d3.

In the present preferred embodiment, the thickness d3 in the inter-electrode film region E3 is smaller than the thickness d1 in the first electrode film underlying region E1 and the thickness d2 in the second electrode film underlying region E2. However, it is sufficient that the thickness d3 in at least a portion of the inter-electrode film region E3 is smaller than the thickness of the piezoelectric layer 14 in the electrode film underlying region. That is, it is sufficient that the thickness d3 in at least a portion of the inter-electrode film region E3 is smaller than at least one of the thickness d1 in the first electrode film underlying region E1 and the thickness d2 in the second electrode film underlying region E2. Thus, in the acoustic wave device 10, it is possible to reduce or prevent the influence of an unnecessary bulk wave on a frequency characteristic, and to reduce or prevent ripples in the frequency characteristic. Advantageous effects described above will be illustrated below by comparing the present preferred embodiment with a comparative example.

The comparative example is different from the first preferred embodiment in that the thicknesses of the piezoelectric layers in the first electrode film underlying region, the second electrode film underlying region, and the inter-electrode film region are the same or substantially the same. In the first preferred embodiment, a reflection characteristic as the frequency characteristic between the first electrode film and the second electrode film was measured. Similarly, in the comparative example, a reflection characteristic between a first electrode film and a second electrode film was measured.

Figure 4:
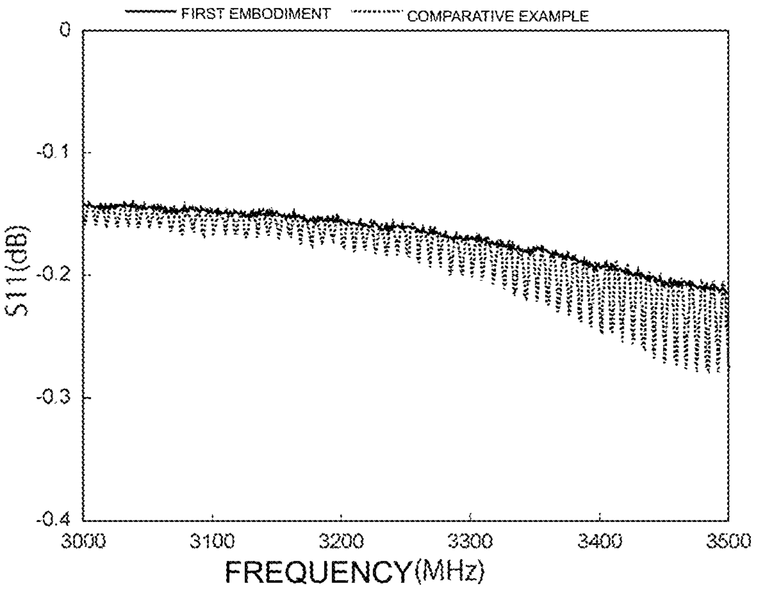
FIG. 4 is a graph showing a reflection characteristic of the first preferred embodiment of the present invention and a comparative example.
Figure 5:
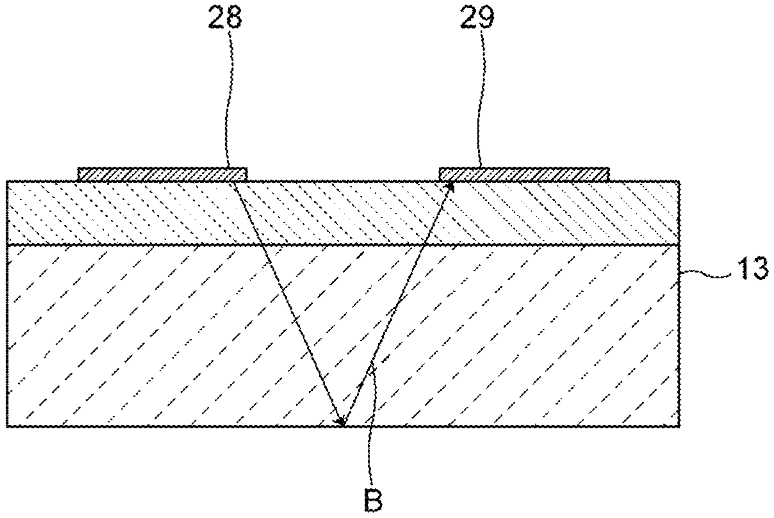
FIG. 5 is a cross-sectional view of the comparative example illustrating an example in which an unnecessary bulk wave propagates.

FIG. 4 is a graph showing the reflection characteristics of the first preferred embodiment and the comparative example. The reflection characteristic shown in FIG. 4 is a relationship between S11 and a frequency. FIG. 5 is a cross-sectional view of the comparative example illustrating an example in which an unnecessary bulk wave propagates. An arrow B in FIG. 5 indicates part of an unnecessary bulk wave.

As shown in FIG. 4, it can be seen that ripples occur in the entire frequency band illustrated in FIG. 4 in the reflection characteristic of the comparative example. As illustrated in FIG. 5, in the comparative example, for example, an unnecessary bulk wave propagated from the first electrode film 28 is reflected in the support substrate. A signal of an unnecessary bulk wave is picked up by the second electrode film 29. Therefore, the ripples illustrated in FIG. 4 occur. On the other hand, it can be seen that the ripples are reduced or prevented in the reflection characteristic of the first preferred embodiment.

For example, when an unnecessary bulk wave propagates from the first electrode film 28 to the second electrode film 29, a portion of the bulk wave passes through a portion of the piezoelectric layer 14 positioned in the first electrode film underlying region E1. Another portion of the bulk wave passes through a portion of the piezoelectric layer 14 positioned in the first electrode film underlying region E1 and a portion of the piezoelectric layer 14 positioned in the inter-electrode film region E3. In the first preferred embodiment, the thickness d1 of the piezoelectric layer 14 in the first electrode film underlying region E1 is different from the thickness d3 of the piezoelectric layer 14 in the inter-electrode film region E3. With this, the electromechanical coupling coefficients may be made different from each other in the first electrode film underlying region E1 and in the inter-electrode film region E3. Therefore, the propagation modes of an unnecessary bulk wave may be made different from each other in the first electrode film underlying region E1 and in the inter-electrode film region E3. The relationship between the second electrode film underlying region E2 and the inter-electrode film region E3 is also the same as the relationship between the first electrode film underlying region E1 and the inter-electrode film region E3. Therefore, it is possible to reduce or prevent an unnecessary bulk wave to uniformly propagate between the first electrode film 28 and the second electrode film 29. Accordingly, it is possible to reduce or prevent the influence of an unnecessary bulk wave on a reflection characteristic, and to reduce or prevent ripples in the reflection characteristic as a frequency characteristic.

Hereinafter, the configuration of the present preferred embodiment will be described in more detail.

As illustrated in FIG. 2, multiple series arm resonators are connected in series with each other between the first signal terminal 25 and the second signal terminal 26. More specifically, the series arm resonator S1, S2, S3, S4, S5, and S6 are connected in this order. The parallel arm resonator P1 is connected between the ground electric potential and a connection point of the series arm resonators S1 and S2. The parallel arm resonator P2 is connected between the ground electric potential and a connection point of the series arm resonators S3 and S4. The parallel arm resonator P3 is connected between the ground electric potential and a connection point of the series arm resonators S5 and S6. Each series arm resonator and each parallel arm resonator may be a resonator divided in series, for example.

Each parallel arm resonator is connected to the ground electric potential via any ground terminal 27 illustrated in FIG. 1. In the present preferred embodiment, the end portions of the parallel arm resonators P1 and P2 on the ground electric potential side are commonly connected to the ground electric potential. However, the circuit configuration described above is merely an example, and the circuit configuration of the acoustic wave device 10 is not particularly limited.

In the present preferred embodiment, the functional electrode of each acoustic wave resonator is, for example, an IDT electrode. This configuration is illustrated below.

Figure 6:
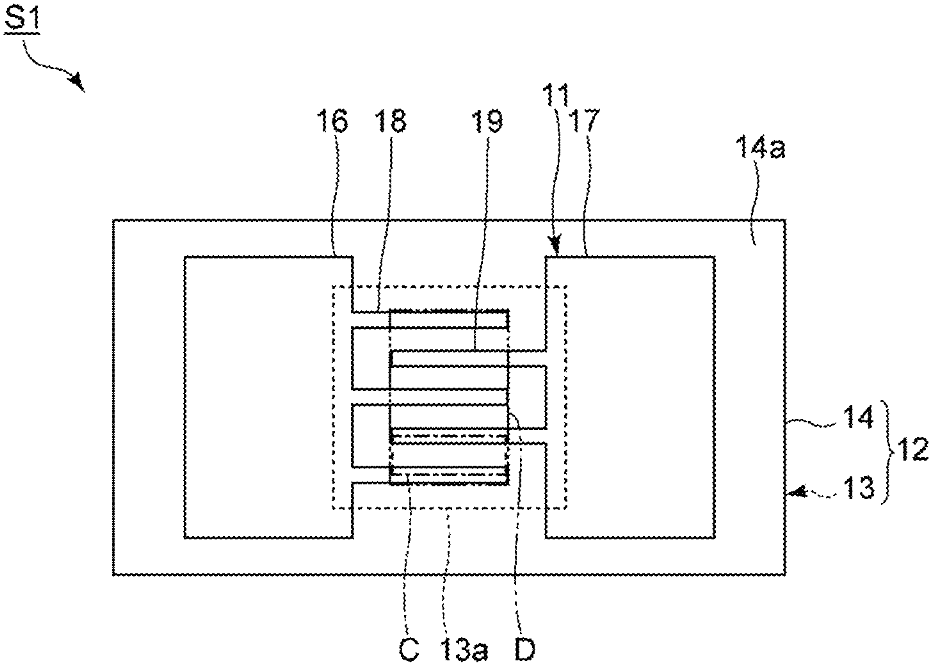
FIG. 6 is a plan view of a series arm resonator according to the first preferred embodiment of the present invention.

FIG. 6 is a plan view of a series arm resonator according to the first preferred embodiment. In FIG. 6, a wiring line electrode film and the like are omitted.

An IDT electrode 11 is provided on the first main surface 14*a* of the piezoelectric layer 14. With this, the series arm resonator S1 is configured. The IDT electrode 11 includes a first busbar 16, a second busbar 17, multiple first electrode fingers 18, and multiple second electrode fingers 19. The first busbar 16 and the second busbar 17 face each other. The first busbar 16 and the second busbar 17 are connected to different wiring line electrode films. The first busbar 16 and the second busbar 17 have different electric potentials from each other.

The first electrode finger 18 is a first electrode. The multiple first electrode fingers 18 are periodically arranged. Each of one ends of the multiple first electrode fingers 18 is connected to the first busbar 16. The second electrode finger 19 is a second electrode. The multiple second electrode fingers 19 are periodically arranged. Each of one ends of the multiple second electrode fingers 19 is connected to the second busbar 17. The multiple first electrode fingers 18 and the multiple second electrode fingers 19 are interdigitated with each other. The IDT electrode 11 may include a single-layer metal film or a multilayer metal film.

In the series arm resonator S1, an acoustic wave is excited by applying an alternating voltage to the IDT electrode 11. As described above, in the first preferred embodiment, the series arm resonator S1 and each of the other acoustic wave resonators use a bulk wave in the thickness shear mode as a main wave. The series arm resonator S1 and each of the other acoustic wave resonators may be resonators using a plate wave such as a Lamb wave as a main wave. On the other hand, in the first preferred embodiment, an SH wave is excited as an unnecessary bulk wave in each acoustic wave resonator.

Here, a direction in which the first electrode finger 18 and the second electrode finger 19 face each other in a plan view is defined as an electrode finger facing direction. The plan view is a direction viewed from above as in FIG. 1 and the like. When viewed from the electrode finger facing direction, a region where adjacent electrode fingers overlap with each other is an overlap region D. The overlap region D is a region including an electrode finger at one end to an electrode finger at the other end of the IDT electrode 11 in the electrode finger facing direction. More specifically, the overlap region D includes an outer edge portion outside of the electrode finger at the one end in the electrode finger facing direction to an outer edge portion outside of the electrode finger at the other end in the electrode finger facing direction.

Further, the series arm resonator S1 includes multiple excitation regions C. The excitation region C is also a region in which adjacent electrode fingers overlap with each other when viewed in the electrode finger facing direction. Each excitation region C is a region between electrode fingers in one pair. More specifically, the excitation region C is a region from a center of one side electrode finger in the electrode finger facing direction to a center of the other side electrode finger in the electrode finger facing direction. Therefore, the overlap region D includes multiple excitation regions C. The bulk wave in the thickness shear mode is excited in each excitation region C. On the other hand, when the series arm resonator S1 uses a plate wave, the overlap region D is an excitation region.

In the first preferred embodiment, the support member 13 includes only a support substrate. However, the support member 13 may be a multilayer body including the support substrate and an insulation layer. In the case above, the piezoelectric layer 14 is provided on the insulation layer. As a material of the insulation layer, a silicon oxide, silicon nitride, tantalum oxide, or the like may be used, for example.

As indicated by a broken line in FIG. 6, the support member 13 includes a through-hole 13*a* as a hollow portion. A piezoelectric layer 14 covers the through-hole 13*a* of the support member 13. In a plan view, the entire or substantially the entire overlap region D overlaps with the through-hole 13*a*. It is sufficient that at least a portion of the IDT electrode 11 overlaps with the through-hole 13*a* in a plan view.

However, the hollow portion is not limited to a through-hole. The hollow portion may be a cavity portion, for example. The cavity portion includes a recess provided in a support member, for example. More specifically, the cavity portion is provided by sealing the recess with a piezoelectric layer or the like. Alternatively, the piezoelectric layer may be provided with a recess opening on the support member side. With this, a hollow portion may be provided. In the case above, the support member need not include a recess or a through-hole.

The multiple acoustic wave resonators in the acoustic wave device 10 share the piezoelectric substrate 12. Each acoustic wave resonator other than the series arm resonator S1 includes an IDT electrode, similar to the series arm resonator S1. Further, the support member 13 includes multiple hollow portions. Each hollow portion overlaps with at least a portion of the IDT electrode of each acoustic wave resonator in a plan view.

Referring back to FIG. 1, the parallel arm resonators P1 and P2 are, for example, acoustic wave resonators adjacent to each other. Further, the first electrode film 28 is connected to one side busbar of the parallel arm resonator P1. The second electrode film 29 is connected to one side busbar of the parallel arm resonator P2. The busbar to which the first electrode film 28 is connected and the busbar to which the second electrode film 29 is connected having different electric potentials from each other. The busbar to which the first electrode film 28 is connected is adjacent to the busbar to which the second electrode film 29 is connected. In the present preferred embodiment, the inter-electrode film region E3 is positioned between the busbar to which the first electrode film 28 is connected and the busbar to which the second electrode film 29 is connected. However, the arrangement of the inter-electrode film region E3 is not limited to the above.

As illustrated in FIG. 1, a distance L between the first electrode film 28 and the second electrode film 29 is different from an aperture length M of an acoustic wave resonator other than the acoustic wave resonators to which the first electrode film 28 and the second electrode film 29 are connected. An aperture length of an acoustic wave resonator refers to a distance between busbars in one pair of the acoustic wave resonator. For example, the aperture length of the series arm resonator S3 is M3, and the aperture length of the series arm resonator S6 is M6. For example, the distance L may be longer or shorter than the shortest aperture length of the aperture lengths M of the other acoustic wave resonators. As in the case of the series arm resonator S6, when the aperture length M6 is not constant, the distance L may be longer or shorter than the shortest aperture length of the aperture length M6, for example.

As described above, it is sufficient that the thickness d3 in at least a portion of the inter-electrode film region E3 is smaller than at least one of the thickness d1 in the first electrode film underlying region E1 and the thickness d2 in the second electrode film underlying region E2. For example, when the inter-electrode film region E3 includes the overlap region D of any acoustic wave resonators, the thickness of the piezoelectric layer 14 in the overlap region D may be the same or substantially the same as the thicknesses d1 and d2.

Figure 7:
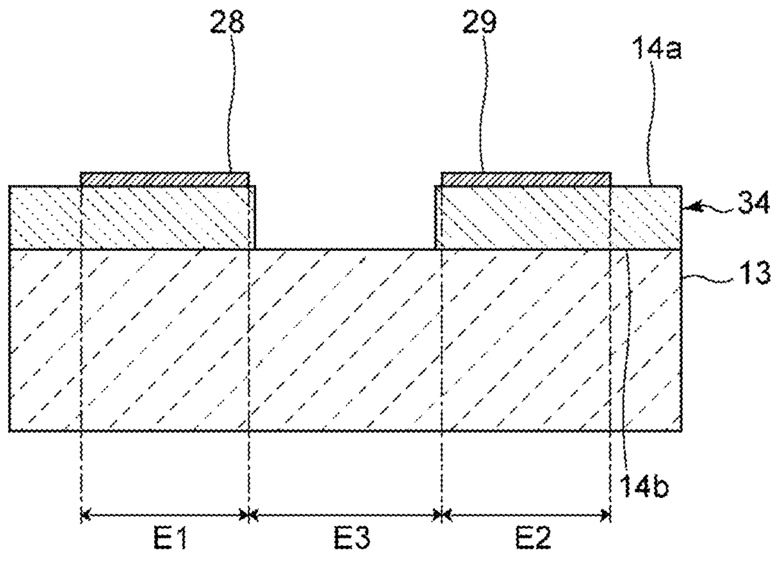
FIG. 7 is a cross-sectional view of an acoustic wave device according to a second preferred embodiment of the present invention illustrating a portion corresponding to the cross section illustrated in FIG. 3.

FIG. 7 is a cross-sectional view of an acoustic wave device according to a second preferred embodiment of the present invention illustrating a portion corresponding to the cross section illustrated in FIG. 3.

As illustrated in FIG. 7, the present preferred embodiment is different from the first preferred embodiment in that a piezoelectric layer 34 is not provided in a portion of the inter-electrode film region E3. In the portion illustrated in FIG. 7, the thickness d3 of the piezoelectric layer 34 is zero in the entire or substantially the entire inter-electrode film region E3. Except for the point described above, the acoustic wave device of the present preferred embodiment has the same or substantially the same configuration as that of the acoustic wave device 10 of the first preferred embodiment.

In the present preferred embodiment, an unnecessary bulk wave propagates through the piezoelectric layer 34 and the support member 13 in the first electrode film underlying region E1 and the second electrode film underlying region E2. On the other hand, an unnecessary bulk wave propagates only through the support member 13 in the inter-electrode film region E3. Therefore, also in the present preferred embodiment, the same as or similar to the first preferred embodiment, the propagation modes of an unnecessary bulk wave may be made different from each other in the first electrode film underlying region E1 and in the inter-electrode film region E3. The relationship between the second electrode film underlying region E2 and the inter-electrode film region E3 is also the same as the relationship between the first electrode film underlying region E1 and the inter-electrode film region E3. Accordingly, it is possible to reduce or prevent the influence of an unnecessary bulk wave on a frequency characteristic and to reduce or prevent ripples in the frequency characteristic.

Figure 8:
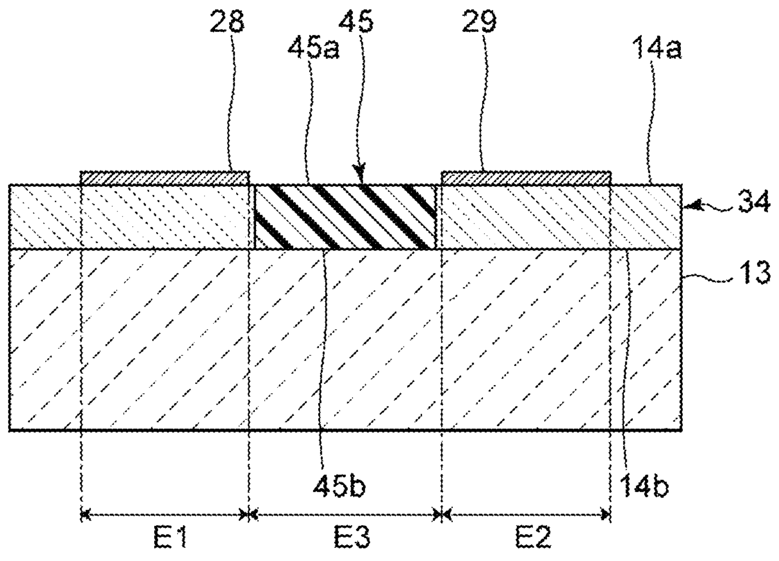
FIG. 8 is a cross-sectional view of an acoustic wave device according to a third preferred embodiment of the present invention illustrating a portion corresponding to the cross section illustrated in FIG. 3.

FIG. 8 is a cross-sectional view of an acoustic wave device according to a third preferred embodiment of the present invention illustrating a portion corresponding to the cross section illustrated in FIG. 3.

The present preferred embodiment is different from the second preferred embodiment in that a dielectric film 45 is provided on the support member 13 in the inter-electrode film region E3. Except for the point described above, the acoustic wave device of the present preferred embodiment has the same or substantially the same configuration as that of the acoustic wave device of the second preferred embodiment.

In the present preferred embodiment, the piezoelectric layer 34 and the support member 13 are laminated in the first electrode film underlying region E1 and the second electrode film underlying region E2. On the other hand, in the inter-electrode film region E3, the dielectric film 45 and the support member 13 are laminated. With this, the electromechanical coupling coefficient may be made different from each other in a portion in the first electrode film underlying region E1 through which an unnecessary bulk wave propagates and in a portion in the inter-electrode film region E3 through which an unnecessary bulk wave propagates. Therefore, the propagation modes of an unnecessary bulk wave may be made different from each other in the first electrode film underlying region E1 and in the inter-electrode film region E3. The relationship between the second electrode film underlying region E2 and the inter-electrode film region E3 is also the same as the relationship between the first electrode film underlying region E1 and the inter-electrode film region E3. Accordingly, it is possible to reduce or prevent the influence of an unnecessary bulk wave on a frequency characteristic and to reduce or prevent ripples in the frequency characteristic.

In a plan view, the dielectric film 45 is provided in an entire or substantially an entire portion where the piezoelectric layer 34 is not provided, in the inter-electrode film region E3. In a plan view, it is sufficient that the dielectric film 45 is provided in at least a portion of a portion where the piezoelectric layer 34 is not provided, in the inter-electrode film region E3.

The Young's modulus of the dielectric film 45 is preferably smaller than the Young's modulus of the support substrate. Thus, an unnecessary bulk wave may effectively be attenuated. Accordingly, ripples in the frequency characteristic may effectively be reduced or prevented. As the material of the dielectric film 45, for example, silicon oxide, silicon nitride, or resin is preferably used. Thus, an unnecessary bulk wave may more reliably be attenuated. However, the material of the dielectric film 45 is not limited to the above.

As in the first preferred embodiment illustrated in FIG. 3, the piezoelectric layer 34 may be provided in the entire or substantially the entire inter-electrode film region E3. In the case above, the dielectric film 45 may be provided on the piezoelectric layer 34 in the inter-electrode film region E3.

As illustrated in FIG. 8, the dielectric film 45 includes a first surface 45*a* and a second surface 45*b*. The first surface 45*a* and the second surface 45*b* are opposed to each other. Of the first surface 45*a* and the second surface 45*b*, the second surface 45*b* is a surface on the support member 13 side. Both of the first surface 45*a* and the second surface 45*b* are flat. The thickness of the dielectric film 45 is constant or substantially constant. In the third preferred embodiment, the thickness of the dielectric film 45 is the same or substantially the same as the thickness of the piezoelectric layer 34. More specifically, the thickness of the dielectric film 45 is the same or substantially the same as the thickness d1 of the piezoelectric layer 34 in the first electrode film underlying region E1 and the thickness d2 of the piezoelectric layer 34 in the second electrode film underlying region E2. The first surface 45*a* of the dielectric film 45 is flush with the first main surface 14*a* of the piezoelectric layer 34. Similarly, the second surface 45*b* of the dielectric film 45 is flush with the second main surface 14*b* of the piezoelectric layer 34.

However, the thickness of the dielectric film 45, the shape of the first surface 45*a*, and the like are not limited to the above. Hereinafter, there will be described first to fourth modifications of the third preferred embodiment that are different from the third preferred embodiment only in the thickness of the dielectric film or the shape of the first surface. Also in the first to fourth modifications, similar to the third preferred embodiment, ripples in the frequency characteristic may be reduced or prevented.

Figure 9:
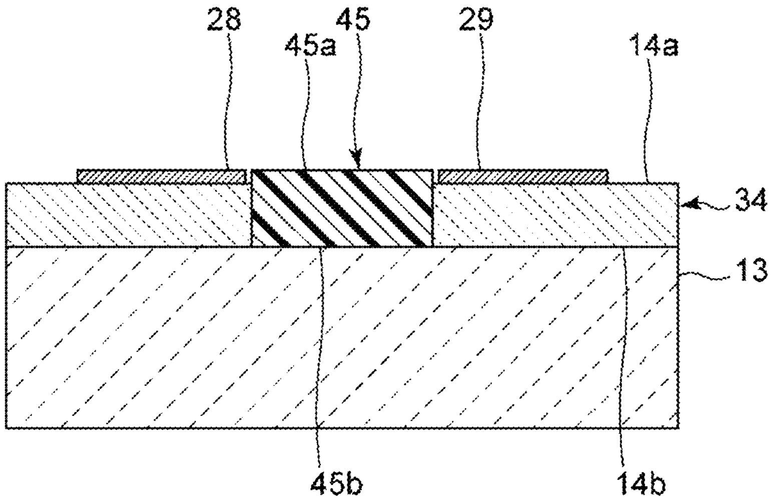
FIG. 9 is a cross-sectional view of an acoustic wave device according to a first modification of the third preferred embodiment of the present invention illustrating a portion corresponding to the cross section illustrated in FIG. 3.

In the first modification illustrated in FIG. 9, the dielectric film 45 extends from the first electrode film 28 to the second electrode film 29. More specifically, when viewed from the direction in which the first electrode film 28 and the second electrode film 29 face each other, the first electrode film 28, the second electrode film 29, and the dielectric film 45 overlap with each other. In the case above, the capacitance between the first electrode film 28 and the second electrode film 29 may be made large.

Figure 10:
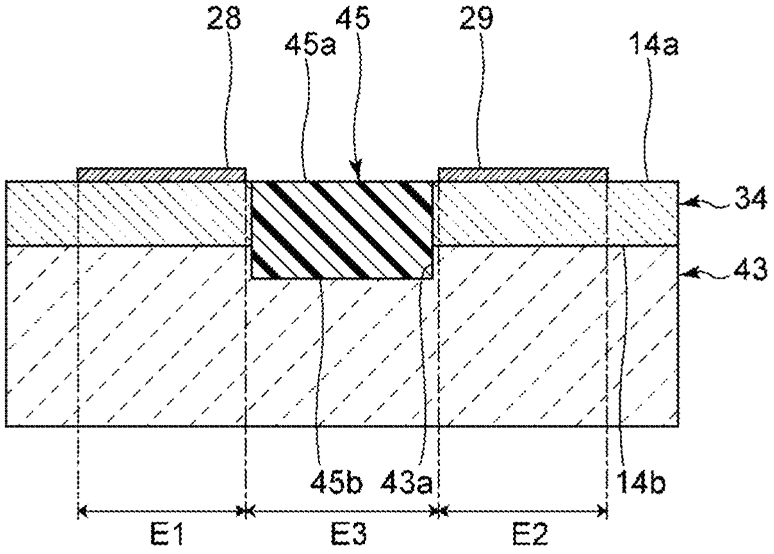
FIG. 10 is a cross-sectional view of an acoustic wave device according to a second modification of the third preferred embodiment of the present invention illustrating a portion corresponding to the cross section illustrated in FIG. 3.

In the second modification illustrated in FIG. 10, a recess 43*a* is provided in a support member 43 in the inter-electrode film region E3. The recess 43*a* is open on a side of a surface, on which the piezoelectric layer 34 is provided, in the support member 43. In the present modification, in a plan view, the recess 43*a* is provided in the entire or substantially the entire portion where the piezoelectric layer 34 is not provided in the inter-electrode film region E3. In a plan view, it is sufficient that the recess 43*a* is provided in at least a portion of a portion where the piezoelectric layer 34 is not provided in the inter-electrode film region E3. The dielectric film 45 fills the inside of the recess 43*a*. More specifically, the dielectric film 45 is provided on a bottom surface of the recess 43*a*.

Figure 11:
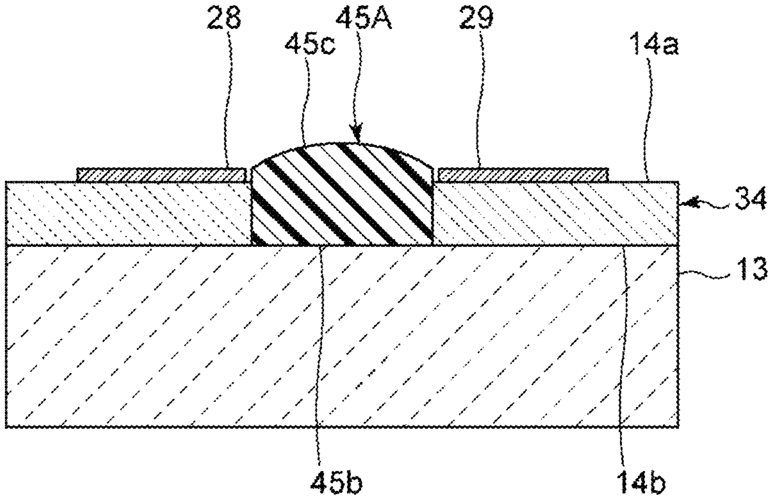
FIG. 11 is a cross-sectional view of an acoustic wave device according to a third modification of the third preferred embodiment of the present invention illustrating a portion corresponding to the cross section illustrated in FIG. 3.

In the third modification illustrated in FIG. 11, a dielectric film 45A extends from the first electrode film 28 to the second electrode film 29, similar to the first modification. However, the dielectric film 45A need not extend from the first electrode film 28 to the second electrode film 29. The thickness of the dielectric film 45A is not constant. More specifically, the thickness of the dielectric film 45A is largest at a center in the direction in which the first electrode film 28 and the second electrode film 29 face each other. The thickness of the dielectric film 45A becomes smaller toward a far side from the center. A first surface 45*c* of the dielectric film 45A has a convex shape to be spaced apart from the support member 13. In the present modification, the shape of the first surface 45*c* is, for example, a curved surface.

Figure 12:
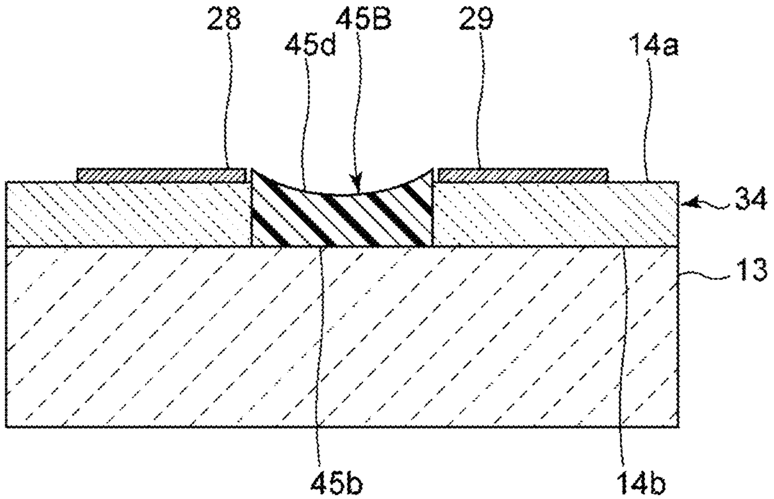
FIG. 12 is a cross-sectional view of an acoustic wave device according to a fourth modification of the third preferred embodiment of the present invention illustrating a portion corresponding to the cross section illustrated in FIG. 3.

In the fourth modification illustrated in FIG. 12, a dielectric film 45B extends from the first electrode film 28 to the second electrode film 29, similar to the first modification. However, the dielectric film 45B need not extend from the first electrode film 28 to the second electrode film 29. The thickness of the dielectric film 45B is not constant. More specifically, the thickness of the dielectric film 45B is smallest at a center in the direction in which the first electrode film 28 and the second electrode film 29 face each other. The thickness of the dielectric film 45B becomes larger toward a far side from the center. A first surface 45*d* of the dielectric film 45B has a convex shape to approach the support member 13. In other words, the first surface 45*d* has a concave shape. In the present modification, the shape of the first surface 45*d* is, for example, a curved surface.

In the first to third preferred embodiments, examples are described in which the influence of a signal of an unnecessary bulk wave may be reduced or prevented when the signal of the unnecessary bulk wave propagates between wiring line electrode films in a filter device. However, the acoustic wave device according to the present invention may be an acoustic wave resonator. In the case above, the first electrode film and the second electrode film may be a first electrode finger and a second electrode finger, for example. In the case above, the inter-electrode film region is positioned between the first electrode finger and the second electrode finger. The first electrode film underlying region is a region overlapping with the first electrode finger in a plan view, and the second electrode film underlying region is a region overlapping with the second electrode finger in a plan view. Alternatively, for example, the first electrode film and the second electrode film may be a first busbar and a second busbar, respectively. In the case above, the inter-electrode film region is positioned between the first busbar and the second busbar. The first electrode film underlying region is a region overlapping with the first busbar in a plan view, and the second electrode film underlying region is a region overlapping with the second busbar in a plan view.

The functional electrode is not limited to the IDT electrode. Hereinafter, another example in which the acoustic wave device is an acoustic wave resonator will be described.

Figure 13:
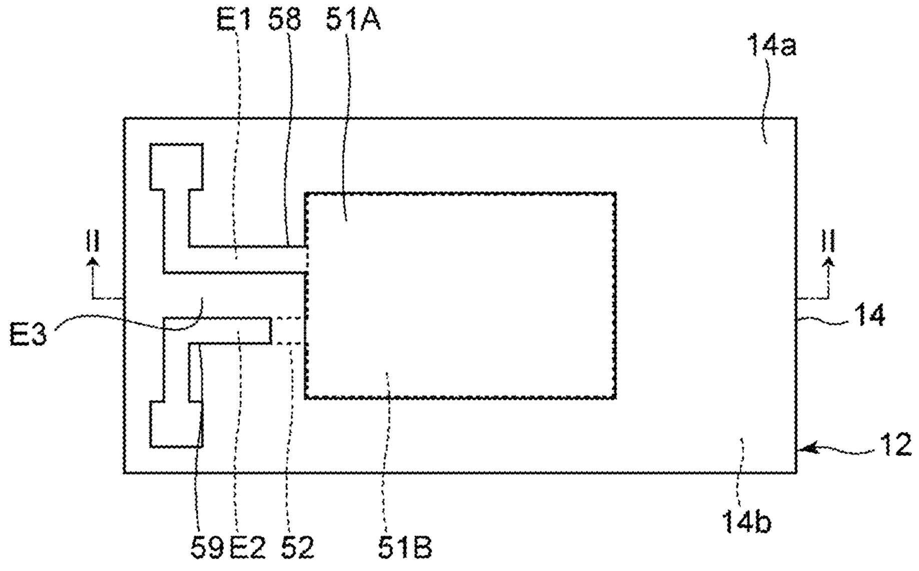
FIG. 13 is a plan view of an acoustic wave device according to a fourth preferred embodiment of the present invention.
Figure 14:
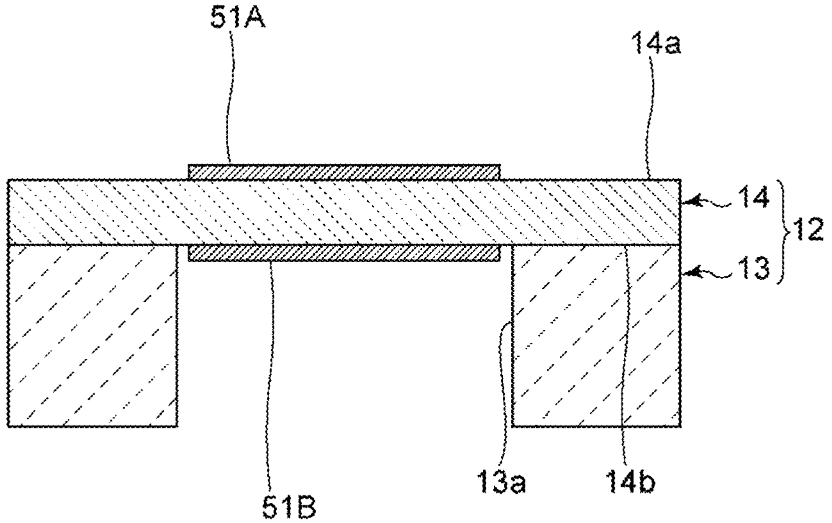
FIG. 14 is a cross-sectional view taken along a line II-II in FIG. 13.

FIG. 13 is a plan view of an acoustic wave device according to a fourth preferred embodiment of the present invention. FIG. 14 is a cross-sectional view taken along a line II-II in FIG. 13.

As illustrated in FIG. 13 and FIG. 14, in the present preferred embodiment, the functional electrode includes an upper electrode 51A and a lower electrode 51B. The upper electrode 51A is provided on the first main surface 14*a* of the piezoelectric layer 14. The lower electrode 51B is provided on the second main surface 14*b* of the piezoelectric layer 14. The upper electrode 51A and the lower electrode 51B face each other with the piezoelectric layer 14 interposed therebetween. The upper electrode 51A and the lower electrode 51B are connected to respective electric potentials different from each other. A region where the upper electrode 51A and the lower electrode 51B face each other is an excitation region.

As illustrated in FIG. 13, a first electrode film 58 and a second electrode film 59 are provided on the first main surface 14*a* of the piezoelectric layer 14. In the present preferred embodiment, the first electrode film 58 and the second electrode film 59 are wiring line electrode films. The first electrode film 58 is connected to the upper electrode 51A. On the other hand, a connection electrode 52 is provided on the second main surface 14*b* of the piezoelectric layer 14. The connection electrode 52 is connected to the lower electrode 51B. A through-hole is provided in the piezoelectric layer 14. The connection electrode 52 is connected to the second electrode film 59 through the through-hole. Therefore, the second electrode film 59 is connected to the lower electrode 51B via the connection electrode 52.

The first electrode film 58 and the second electrode film 59 face each other. In the present preferred embodiment, the first electrode film underlying region E1, the second electrode film underlying region E2, and the inter-electrode film region E3 in the piezoelectric layer 14 are provided, similar to the configuration of the first preferred embodiment illustrated in FIG. 3. That is, the thickness d3 of the piezoelectric layer 14 in the inter-electrode film region E3 is smaller than the thicknesses d1 of the piezoelectric layer 14 in the first electrode film underlying region E1 and the thicknesses d2 of the piezoelectric layer 14 in the second electrode film underlying region E2. Therefore, the propagation modes of an unnecessary bulk wave may be made different from each other in the first electrode film underlying region E1 and the inter-electrode film region E3. The relationship between the second electrode film underlying region E2 and the inter-electrode film region E3 is also the same as the relationship between the first electrode film underlying region E1 and the inter-electrode film region E3. Accordingly, ripples in the frequency characteristic may be reduced or prevented.

BAW (Bulk Acoustic Wave) such as in the acoustic wave device of the present preferred embodiment may be applied to the filter device illustrated in FIG. 1. In the case above, the first electrode film and the second electrode film may be wiring line electrode films connected to different acoustic wave resonators, similar to the first preferred embodiment.

Hereinafter, a thickness shear mode and a plate wave will be described in detail. A support member in the following example corresponds to the support substrate.

Figure 15A:
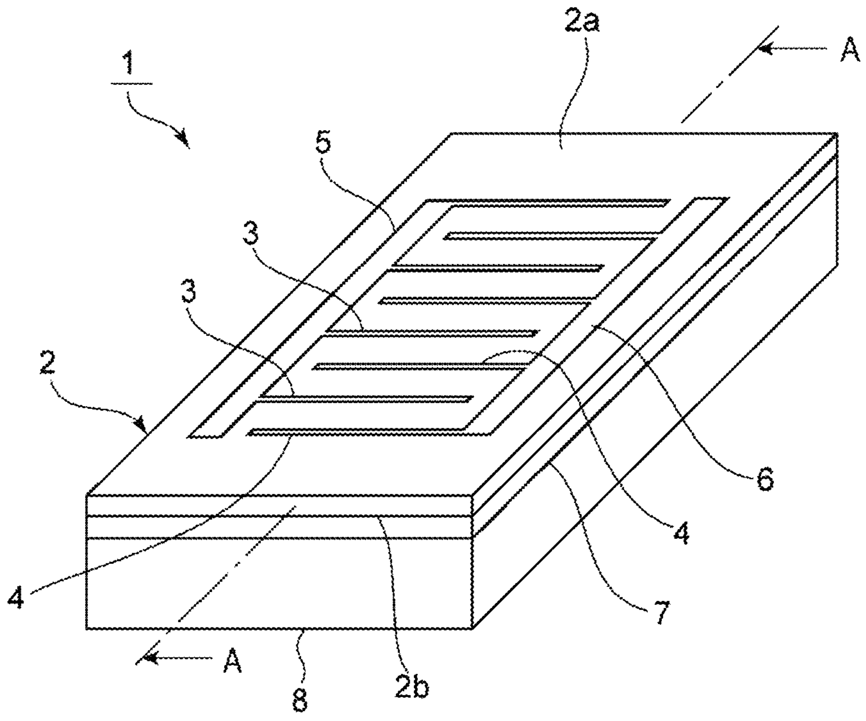
FIG. 15A is a schematic perspective view of an acoustic wave device using a bulk wave in a thickness shear mode illustrating an external appearance thereof.
Figure 15B:
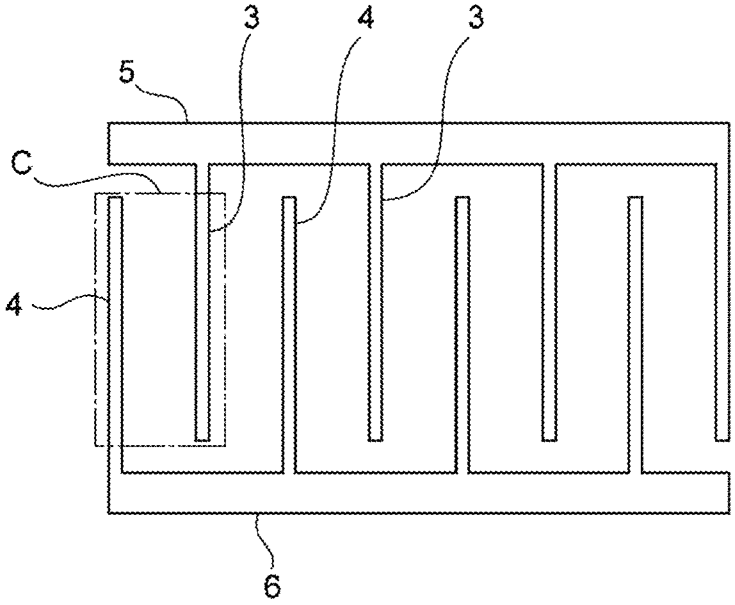
FIG. 15B is a plan view illustrating an electrode structure on a piezoelectric layer.
Figure 16:
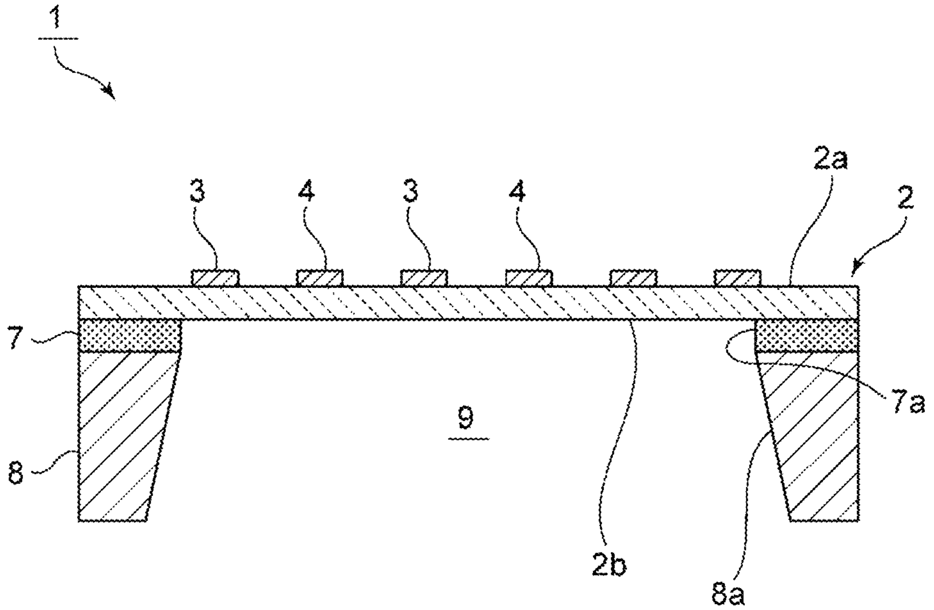
FIG. 16 is a cross-sectional view of a portion taken along a line A-A in FIG. 15A.

FIG. 15A is a schematic perspective view of an example of an acoustic wave device using a bulk wave in a thickness shear mode illustrating an external appearance thereof, FIG. 15B is a plan view illustrating an electrode structure on a piezoelectric layer, and FIG. 16 is a cross-sectional view of a portion taken along a line A-A in FIG. 15A.

An acoustic wave device 1 includes a piezoelectric layer 2 made of, for example, $LiNbO_3$. The piezoelectric layer 2 may be made of, for example, $LiTaO_3$. The cut-angle of $LiNbO_3$ or $LiTaO_3$ is, for example, a Z-cut, but may be a rotated Y-cut or an X-cut. Although the thickness of the piezoelectric layer 2 is not particularly limited, in order to effectively excite a thickness shear mode, the thickness of the piezoelectric layer 2 is, for example, preferably about 40 nm or more and about 1000 nm or less, and more preferably about 50 nm or more and about 600 nm or less. The piezoelectric layer 2 has a first main surface 2*a* and a second main surface 2*b* opposed to each other. An electrode 3 and an electrode 4 are provided on the first main surface 2*a*. Here, the electrode 3 is an example of the "first electrode", and the electrode 4 is an example of the "second electrode". In FIGS. 15A and 15B, the multiple electrodes 3 are connected to a first busbar 5. The multiple electrodes 4 are connected to a second busbar 6. The multiple electrodes 3 and the multiple electrodes 4 are interdigitated with each other. The electrode 3 and the electrode 4 have a rectangular or substantially rectangular shape and have a longitudinal direction. The electrode 3 and the adjacent electrode 4 face each other in a direction orthogonal or substantially orthogonal to the longitudinal direction. The longitudinal direction of the electrodes 3 and 4 and the direction orthogonal or substantially orthogonal to the longitudinal direction of the electrodes 3 and 4 are both directions intersecting with a thickness direction of the piezoelectric layer 2. Therefore, it may also be said that the electrode 3 and the adjacent electrode 4 face each other in a direction intersecting with the thickness direction of the piezoelectric layer 2. Further, the longitudinal direction of the electrodes 3 and 4 may be exchanged with a direction orthogonal or substantially orthogonal to the longitudinal direction of the electrodes 3 and 4 illustrated in FIGS. 15A and 15B. That is, in FIGS. 15A and 15B, the electrodes 3 and 4 may extend in a direction in which the first busbar 5 and the second busbar 6 extend. In the case above, the first busbar 5 and the second busbar 6 extend in a direction in which the electrodes 3 and 4 extend in FIGS. 15A and 15B. Then, the electrode 3 connected to one side electric potential and the electrode 4 connected to the other side electric potential adjacent to each other makes a structure of one pair, and the multiple pairs are provided in the direction orthogonal or substantially orthogonal to the longitudinal direction of the electrodes 3 and 4. Here, the electrode 3 and the electrode 4 being adjacent to each other refers not to a case that the electrode 3 and the electrode 4 are arranged to be in direct contact with each other, but to a case that the electrode 3 and the electrode 4 are arranged with a gap therebetween. Further, when the electrode 3 and the electrode 4 are adjacent to each other, an electrode connected to a hot electrode or a ground electrode, including other electrodes 3 and 4, is not provided between the electrode 3 and the electrode 4. The number of pairs need not be an integer, and may be, for example, 1.5, 2.5, or the like. The distance between centers of the electrodes 3 and 4, that is, the pitch is preferably in a range of about 1 μm or more and about 10 μm or less, for example. Further, the width of the electrodes 3 and 4, that is, the size of the electrodes 3 and 4 in the facing direction is preferably in a range of about 50 nm or more and about 1000 nm or less, and more preferably in a range of about 150 nm or more and about 1000 nm or less, for example. The distance between the centers of the electrodes 3 and 4 is the distance between a center of the size (width size) of the electrode 3 in the direction orthogonal or substantially orthogonal to the longitudinal direction of the electrode 3 and a center of the size (width size) of the electrode 4 in the direction orthogonal or substantially orthogonal to the longitudinal direction of the electrode 4.

Further, since the acoustic wave device 1 uses a Z-cut piezoelectric layer, the direction orthogonal or substantially orthogonal to the longitudinal direction of the electrodes 3 and 4 is orthogonal or substantially orthogonal to a polarization direction of the piezoelectric layer 2. This is not the case when a piezoelectric body having another cut-angle is used as the piezoelectric layer 2. Here, "orthogonal" is not limited only to being strictly orthogonal but may be substantially orthogonal (an angle formed by the direction orthogonal to the longitudinal direction of the electrodes 3 and 4 and the polarization direction is within a range of about 90°±10°, for example).

A support member 8 is laminated on the piezoelectric layer 2 on the second main surface 2*b* side via an insulation layer 7. The insulation layer 7 and the support member 8 have a frame shape, and include through-holes 7*a* and 8*a* as illustrated in FIG. 16. Thus, a hollow portion 9 is formed. The hollow portion 9 is provided not to interfere with the vibration in the excitation region C of the piezoelectric layer 2. Accordingly, the support member 8 is laminated on the second main surface 2*b* via the insulation layer 7 at a position not overlapping with a portion where at least one pair of electrodes 3 and 4 is provided. The insulation layer 7 is not necessary. Accordingly, the support member 8 may directly or indirectly be laminated on the second main surface 2*b* of the piezoelectric layer 2.

The insulation layer 7 is made of, for example, silicon oxide. However, for example, in addition to silicon oxide, an appropriate insulation material such as silicon oxynitride, alumina or the like may be used. The support member 8 is made of, for example, Si. The plane orientation of the surface of Si on the piezoelectric layer 2 side may be (100), (110), or (111). Si of the support member 8 preferably has high resistance of about 2 kΩ or more in resistivity, and more preferably has high resistance of about 4 kΩ or more in resistivity, for example. However, the support member 8 may also be made using an appropriate insulation material or semiconductor material.

The multiple electrodes 3 and 4, and the first busbar 5 and the second busbar 6 are made of an appropriate metal or alloy such as, for example, Al, an AlCu alloy or the like. In the present preferred embodiment, the electrodes 3 and 4, and the first busbar 5 and the second busbar 6 have, for example, a structure in which an Al film is laminated on a Ti film. An adhesion layer other than the Ti film may be used.

At the time of driving, an alternating voltage is applied between the multiple electrodes 3 and the multiple electrodes 4. More specifically, an alternating voltage is applied between the first busbar 5 and the second busbar 6. Thus, it is possible to obtain a resonant characteristic using a bulk wave in a thickness shear mode excited in the piezoelectric layer 2. Further, in the acoustic wave device 1, when the thickness of the piezoelectric layer 2 is denoted as d and the distance between centers of any adjacent electrodes 3 and 4 of the multiple pairs of electrodes 3 and 4 is denoted as p, d/p is about 0.5 or less, for example. Therefore, the bulk wave in a thickness shear mode is effectively excited, and a preferable resonant characteristic may be obtained. More preferably, d/p is, for example, about 0.24 or less, and in that case, an even better resonant characteristic may be obtained.

Since the acoustic wave device 1 has the configuration described above, when the number of pairs of the electrodes 3 and 4 is decreased in order to achieve a reduction in size, a decrease in a Q factor is less likely to occur. This is because the propagation loss is small, even when the number of electrode fingers in the reflectors on both sides is decreased. Further, the reason why the number of the electrode fingers may be decreased is that a bulk wave in a thickness shear mode is used. The difference between a Lamb wave used in the acoustic wave device and a bulk wave in the thickness shear mode above will be described with reference to FIGS. 17A and 17B.

Figure 17A:
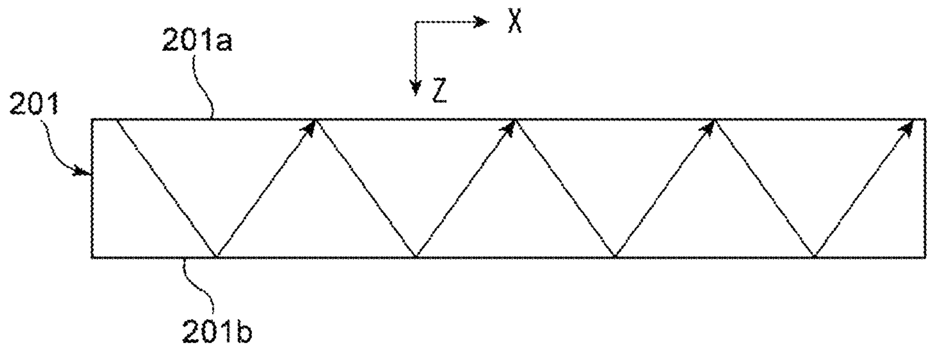
FIG. 17A is a schematic elevational cross-sectional view for explaining a Lamb wave propagating through a piezoelectric film of an acoustic wave device.

FIG. 17A is a schematic elevational cross-sectional view for explaining a Lamb wave propagating through a piezoelectric film of an acoustic wave device as described in Japanese Unexamined Patent Application Publication No. 2012-257019. Here, a wave propagates through a piezoelectric film 201 as indicated by an arrow. Here, in the piezoelectric film 201, a first main surface 201*a* and a second main surface 201*b* are opposed to each other, and a thickness direction connecting the first main surface 201*a* and the second main surface 201*b* is a Z-direction. An X-direction is a direction in which electrode fingers of an IDT electrode are arranged side by side. As illustrated in FIG. 17A, in a Lamb wave, a wave propagates in the X-direction as illustrated. Although the entire piezoelectric film 201 vibrates because of a plate wave, since the wave propagates in the X-direction, reflectors are provided on both sides to obtain a resonant characteristic. Therefore, propagation loss of the wave occurs, and the Q factor decreases when achieving a reduction in size, that is, when the number of pairs of electrode fingers is decreased.

Figure 17B:
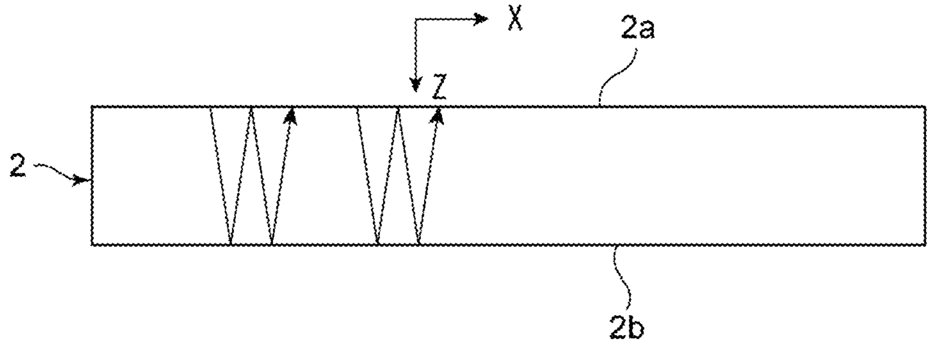
FIG. 17B is a schematic elevational cross-sectional view for explaining a bulk wave in a thickness shear mode propagating through a piezoelectric film in an acoustic wave device.

On the other hand, as illustrated in FIG. 17B, in the acoustic wave device 1, since the vibration displacement is in a thickness shear direction, a wave propagates in a direction connecting the first main surface 2*a* and the second main surface 2*b* of the piezoelectric layer 2, that is, substantially in the Z-direction, and resonates. That is, an X-direction component of a wave is much smaller than a Z-direction component. Since a resonant characteristic is obtained by the propagation of a wave in the Z-direction, propagation loss is less likely to occur even when the number of electrode fingers of the reflector is decreased. Furthermore, even when the number of pairs of electrodes 3 and 4 is decreased in order to promote a reduction in size, the Q factor is less likely to decrease.

Figure 18:
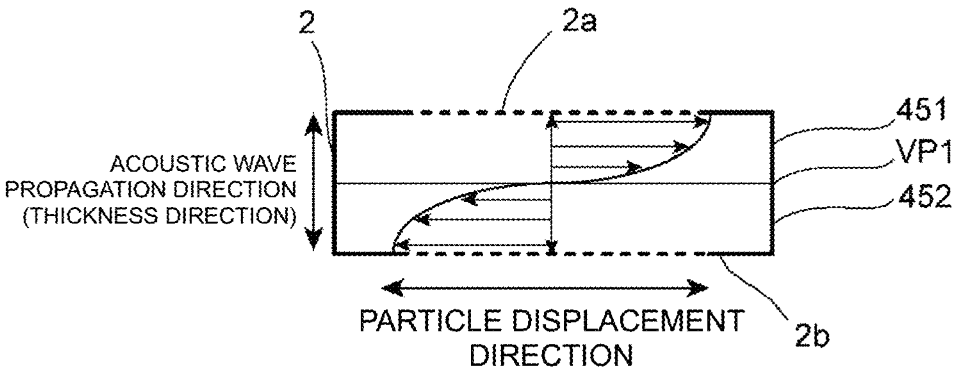
FIG. 18 is a diagram illustrating an amplitude direction of a bulk wave in a thickness shear mode.

As illustrated in FIG. 18, the amplitude direction of a bulk wave in a thickness shear mode is opposite, of the piezoelectric layer 2, in a first region 451 included in the excitation region C and in a second region 452 included in the excitation region C. In FIG. 18, a bulk wave is schematically illustrated in a case of a voltage being applied between the electrode 3 and the electrode 4 such that the electrode 4 has a higher electric potential than that of the electrode 3. The first region 451 is a region of the excitation region C, between the first main surface 2*a* and a virtual plane VP1 that is orthogonal or substantially orthogonal to the thickness direction of the piezoelectric layer 2 and divides the piezoelectric layer 2 into two portions. The second region 452 is a region of the excitation region C, between the second main surface 2*b* and the virtual plane VP1.

As described above, in the acoustic wave device 1, at least one pair of electrodes including the electrode 3 and the electrode 4 is provided. However, since a wave is not propagated in the X-direction, the number of pairs of electrodes including the electrodes 3 and 4 need not be multiple. That is, it is sufficient that at least one pair of electrodes is provided.

For example, the electrode 3 is an electrode connected to a hot electric potential, and the electrode 4 is an electrode connected to a ground electric potential. However, the electrode 3 may be connected to a ground electric potential and the electrode 4 may be connected to a hot electric potential. In the present preferred embodiment, as described above, at least electrodes in one pair includes an electrode connected to a hot electric potential and an electrode connected to a ground electric potential, and do not include a floating electrode.

Figure 19:
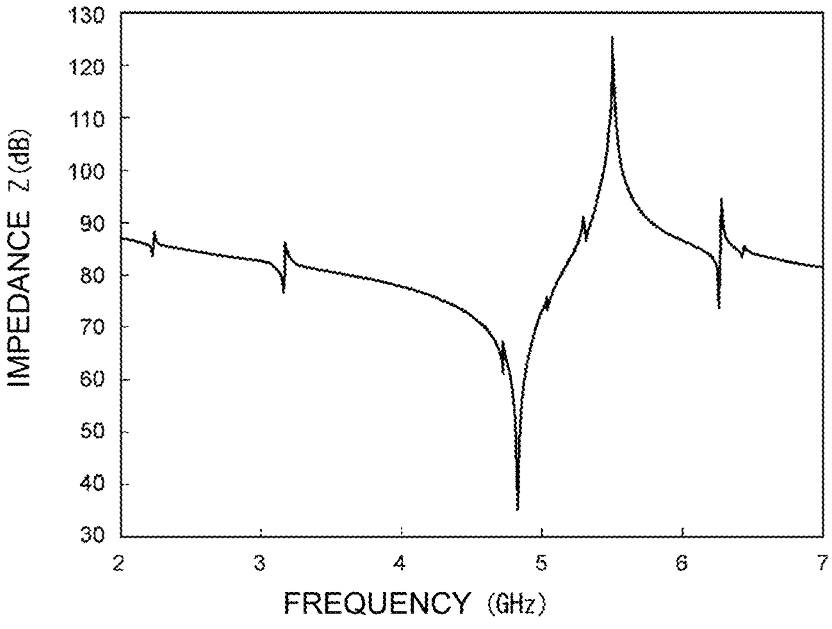
FIG. 19 is a graph showing a resonant characteristic of an acoustic wave device using a bulk wave in a thickness shear mode.

FIG. 19 is a graph showing the resonant characteristic of the acoustic wave device 1 illustrated in FIG. 16. The design parameters of the acoustic wave device 1 having obtained the resonant characteristic above are as follows.

Piezoelectric layer 2: $LiNbO_3$ of Euler angles (0°, 0°, 90°), thickness is about 400 nm.

When viewed in the direction orthogonal or substantially orthogonal to the longitudinal direction of the electrodes 3 and 4, a length of a region where the electrodes 3 and 4 overlap with each other, that is, a length of the excitation region C is about 40 μm, the number of pairs of electrodes 3 and 4 is 21, the distance between centers of the electrodes is about 3 μm, the width of the electrodes 3 and 4 is about 500 nm, and d/p is about 0.133.

Insulation layer 7: silicon oxide film of about 1 μm thickness.

Support member 8: Si.

The length of the excitation region C is a size of the excitation region C along the longitudinal direction of the electrodes 3 and 4.

In the present preferred embodiment, inter-electrode distances of the electrode pairs including the electrodes 3 and 4 are all made equal or substantially equal in multiple pairs. That is, the electrodes 3 and the electrodes 4 are arranged with equal or substantially equal pitches.

As is clear in FIG. 19, a preferable resonant characteristic with a fractional bandwidth of about 12.5% is obtained even though no reflectors are provided.

When the thickness of the piezoelectric layer 2 is denoted as d, and the distance between electrode centers of the electrodes 3 and 4 is denoted as p, d/p is, for example, preferably about 0.5 or less, and more preferably about 0.24 or less in the present preferred embodiment as described above. This will be described with reference to FIG. 20.

Figure 20:
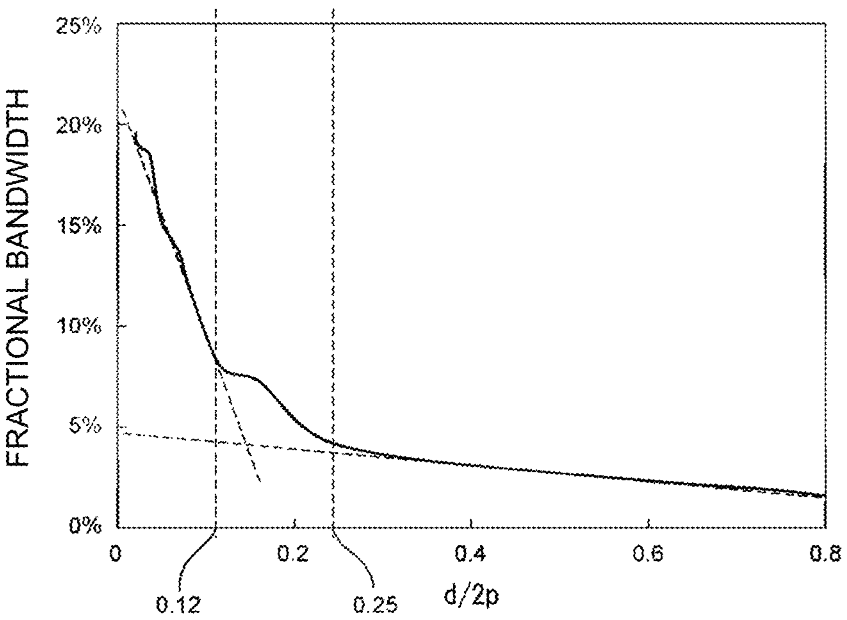
FIG. 20 is a graph showing a relationship between d/2p and a fractional bandwidth as a resonator, when a distance between centers of adjacent electrodes is denoted as p and a thickness of a piezoelectric layer is denoted as d.

In the same manner as the acoustic wave device having obtained the resonant characteristic illustrated in FIG. 19, but by varying d/2p, multiple acoustic wave devices are obtained. FIG. 20 is a graph showing a relationship between d/2p and the fractional bandwidth of an acoustic wave device as a resonator.

As is clear in FIG. 20, when d/2p exceeds about 0.25, that is, when d/p>about 0.5, the fractional bandwidth is less than about 5% even when d/p is adjusted. On the other hand, when d/2p≤about 0.25, that is, d/p≤about 0.5, the fractional bandwidth may be set to about 5% or more by changing d/p within that range. That is, a resonator having a high coupling coefficient may be provided. When d/2p is about 0.12 or less, that is, d/p is about 0.24 or less, the fractional bandwidth may be increased to about 7% or more. In addition, when d/p is adjusted within the range above, a resonator having a still wider fractional bandwidth may be obtained, and a resonator having a still higher coupling coefficient may be obtained. Accordingly, as in a fourth preferred embodiment of the present application, it can be seen that a resonator having a high coupling coefficient using a bulk wave in the thickness shear mode above may be provided by setting d/p to about 0.5 or less.

As described above, the number of pairs of at least one pair of electrodes may be one.

For example, when the piezoelectric layer 2 has a variation in thickness, a value obtained by averaging the thickness may be used.

Figure 21:
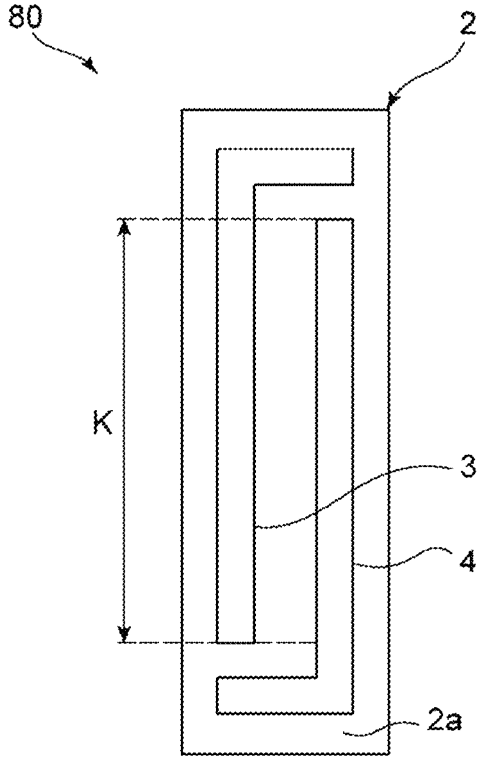
FIG. 21 is a plan view of an acoustic wave device using a bulk wave in a thickness shear mode.

FIG. 21 is a plan view of an acoustic wave device using a bulk wave in a thickness shear mode. In an acoustic wave device 80, one pair of electrodes including electrodes 3 and 4 is provided on the first main surface 2a of the piezoelectric layer 2. Note that K in FIG. 21 is an overlap width. As described above, in the acoustic wave device according to a preferred embodiment of the present invention, the number of pairs of electrodes may be one. Also in the case above, when d/p is about 0.5 or less, a bulk wave in a thickness shear mode may effectively be excited.

Figure 22:
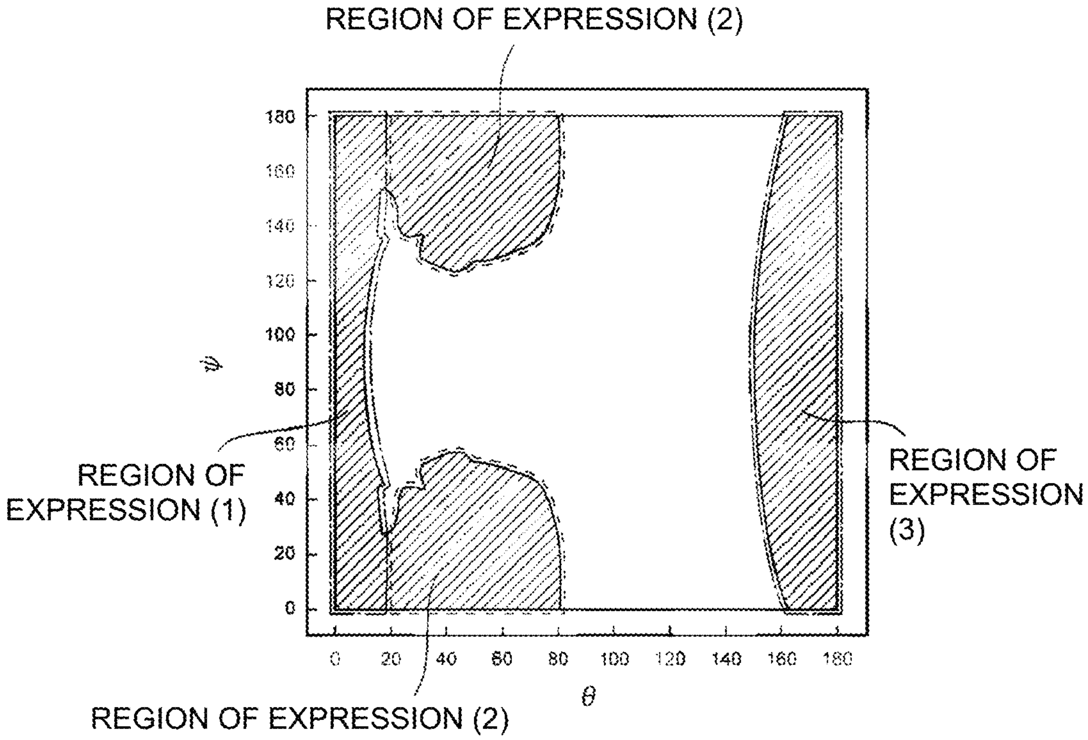
FIG. 22 is a diagram illustrating a map of a fractional bandwidth with respect to Euler angles (0°, θ, ψ) of $LiNbO_3$ when d/p is made as close to zero as possible.

FIG. 22 is a chart illustrating a map of a fractional bandwidth with respect to Euler angles (0°, θ, ψ) of $LiNbO_3$ when d/p is brought toward zero as close as possible. A hatched portion in FIG. 22 is a region in which a fractional bandwidth of at least about 5% or more is obtained, and when a range of the region is approximated, the range is represented by the following Expression (1), Expression (2), and Expression (3).

$$(0°\pm10°,\ 0° \text{ to } 20°,\ \text{any } \psi) \qquad \text{Expression (1)}$$

$$(0°\pm10°,\ 20° \text{ to } 80°,\ 0° \text{ to } 60° (1-(\theta-50)^2/900)^{1/2}) \text{ or } (0°\pm10°,\ 20° \text{ to } 80°,\ [180°-60° (1-(\theta-50)^2/900)^{1/2}] \text{ to } 180°) \qquad \text{Expression (2)}$$

$$(0°\pm10°,\ [180°-30° (1-(\psi-90)^2/8100)^{1/2}] \text{ to } 180°,\ \text{any } \psi) \qquad \text{Expression (3)}$$

Accordingly, in a case of Euler angles in the range of Expression (1), Expression (2) or Expression (3) above, the fractional bandwidth may sufficiently be widened, and is preferable.

Figure 23:
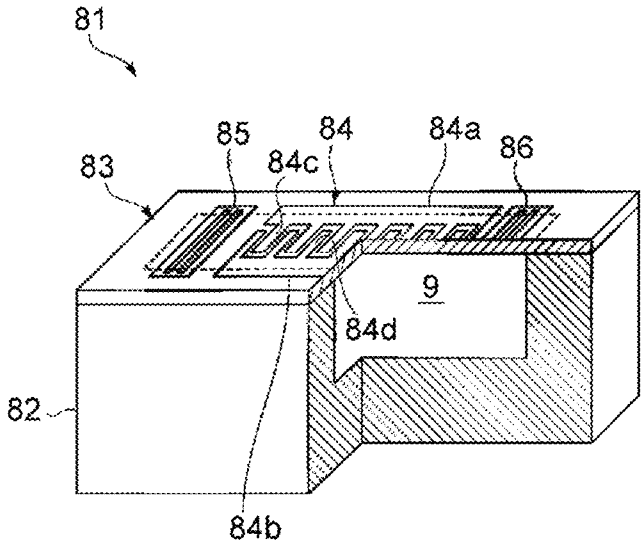
FIG. 23 is a partially cutaway perspective view for explaining an acoustic wave device using a Lamb wave.

FIG. 23 is a partially cutaway perspective view for explaining an acoustic wave device using a Lamb wave. A broken line in FIG. 23 indicates a position of the hollow portion 9 viewed from a piezoelectric layer 83 side.

An acoustic wave device 81 includes a support substrate 82. The support substrate 82 includes a recess that is open to an upper surface. A piezoelectric layer 83 is laminated on the support substrate 82. Thus, the hollow portion 9 is provided. An IDT electrode 84 is provided on the piezoelectric layer 83 above the hollow portion 9. Reflectors 85 and 86 are provided on both sides of the IDT electrode 84 in an acoustic wave propagation direction. In FIG. 23, the outer peripheral edge of the hollow portion 9 is indicated by the broken line. Here, the IDT electrode 84 includes a first busbar 84a and a second busbar 84b, multiple electrodes 84c as first electrode fingers, and multiple electrodes 84d as second electrode fingers. The multiple electrodes 84c are connected to the first busbar 84a. The multiple electrodes 84d are connected to the second busbar 84b. The multiple electrodes 84c and the multiple electrodes 84d are interdigitating with each other.

In the acoustic wave device 81, a Lamb wave as a plate wave is excited by applying an alternating electric field to the IDT electrode 84 above the hollow portion 9. Since the reflectors 85 and 86 are provided on both sides, a resonant characteristic caused by the Lamb wave may be obtained.

The thickness d of the piezoelectric layer 2, illustrated in FIG. 16 and the like, is the thickness in the excitation region C.

In the first preferred embodiment illustrated in FIG. 1, each acoustic wave resonator uses a thickness shear mode for a main wave. The acoustic wave device 81 illustrated in FIG. 23 may be used as each acoustic wave resonator. In the case above, each acoustic wave resonator uses a Lamb wave, being a plate wave, as a main wave. However, the first busbar 84a and the second busbar 84b, or the electrode 84c and the electrode 84d of the acoustic wave device 81 may be the first electrode film and the second electrode film.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device, comprising:

a support substrate;

a piezoelectric layer on the support substrate;

a functional electrode on the piezoelectric layer; and a first electrode film and a second electrode film on the piezoelectric layer, facing each other, and having different electric potentials from each other; wherein when a region between the first electrode film and the second electrode film adjacent to each other in a plan view is defined as an inter-electrode film region, and a region overlapping with the first electrode film or the second electrode film in a plan view is defined as an electrode film underlying region, a thickness of the piezoelectric layer in at least a portion of the inter-electrode film region is smaller than a thickness of the piezoelectric layer in the electrode film underlying region; and the inter-electrode film region between the first electrode film and the second electrode film adjacent to each other is not provided with an electrode film.

2. The acoustic wave device according to claim 1, wherein the piezoelectric layer is not provided in at least a portion of the inter-electrode film region.

3. The acoustic wave device according to claim 2, wherein a recess is provided in the support substrate in at least a portion of the inter-electrode film region.

4. The acoustic wave device according to claim 1, wherein the piezoelectric layer is provided in at least a portion of the inter-electrode film region.

5. The acoustic wave device according to claim 1, further comprising a dielectric film in at least a portion of the inter-electrode film region.

6. The acoustic wave device according to claim 5, wherein the dielectric film is made of silicon oxide, silicon nitride, or resin.

7. The acoustic wave device according to claim 1, wherein the acoustic wave device is structured to generate a Shear Horizontal wave.

8. The acoustic wave device according to claim 1, wherein the piezoelectric layer is made of lithium niobate or lithium tantalate.

9. The acoustic wave device according to claim 8, wherein the functional electrode includes at least one pair of electrodes facing each other, and is structured to generate a bulk wave in a thickness shear mode.

10. The acoustic wave device according to claim 8, wherein the functional electrode includes at least one pair of electrodes facing each other; and when a thickness of the piezoelectric layer is denoted as d and a distance between centers of the adjacent electrodes is denoted as p, d/p≤about 0.5.

11. The acoustic wave device according to claim 9, wherein the functional electrode is an IDT electrode, and the pair of electrodes are electrode fingers of the IDT electrode.

12. The acoustic wave device according to claim 9, wherein

Euler angles (φ, θ, ψ) of lithium niobate or lithium tantalate of the piezoelectric layer are in a range of the Expression (1), Expression (2), or Expression (3):

$$(0°\pm10°,\ 0° \text{ to } 20°,\ \text{any } \psi) \qquad \text{Expression (1);}$$

$(0°\pm10°, 20° \text{ to } 80°, 0° \text{ to } 60° (1-(\theta-50)^2/900)^{1/2})$ or $(0°\pm10°, 20° \text{ to } 80°, [180°-60° (1-(\theta-50)^2/900)^{1/2}] \text{ to } 180°)$ Expression (2); or $(0°\pm10°, [180°-30° (1-(\psi-90)^2/8100)^{1/2}] \text{ to } 180°, \text{any } \psi)$ Expression (3).

13. The acoustic wave device according to claim 1, wherein the functional electrode is an IDT electrode and is structured to generate a plate wave.

14. The acoustic wave device according to claim 1, wherein the piezoelectric layer includes a first main surface and a second main surface opposed to each other;

the first electrode film and the second electrode film are on the first main surface;

the functional electrode includes an upper electrode on the first main surface and a lower electrode provided on the second main surface; and the upper electrode and the lower electrode face each other.

15. The acoustic wave device according to claim 1, wherein the acoustic wave device is a filter device including multiple acoustic wave resonators;

each of the multiple acoustic wave resonators includes the functional electrode, each of the functional electrodes is an IDT electrode, each of the IDT electrodes includes one pair of busbars having different electric potentials from each other;

the first electrode film is connected to the busbar of one acoustic wave resonator of the acoustic wave resonators adjacent to each other, and the second electrode film is connected to the busbar of another acoustic wave resonator of the acoustic wave resonators adjacent to each other; and the inter-electrode film region is between the busbar to which the first electrode film is connected and the busbar to which the second electrode film is connected.

16. The acoustic wave device according to claim 10, wherein d/p≤about 0.24.

17. The acoustic wave device according to claim 1, wherein the support substrate is a silicon substrate.

18. The acoustic wave device according to claim 5, wherein the dielectric film is provided in an entire or substantially an entire portion at which the piezoelectric layer is not provided, in the inter-electrode film region.

19. The acoustic wave device according to claim 5, wherein a Young's modulus of the dielectric film is smaller than a Young's modulus of the support substrate.

20. The acoustic wave device according to claim 5, wherein the dielectric film includes a first surface and a second surface opposed to each other;

the second surface is on a side of the support substrate;

both of the first and second surfaces are flat; and a thickness of the dielectric film is constant or substantially constant.

* * * * *